United States Patent [19]

Ishida et al.

[11] Patent Number: 5,739,558
[45] Date of Patent: Apr. 14, 1998

[54] HIGH ELECTRON MOBILITY TRANSISTOR INCLUDING ASYMMETRICAL CARRIER SUPPLY LAYERS SANDWICHING A CHANNEL LAYER

[75] Inventors: Takao Ishida; Naohito Yoshida, both of Tokyo, Japan

[73] Assignee: Mitsubishi Denki Kabushiki Kaisha, Tokyo, Japan

[21] Appl. No.: 786,210

[22] Filed: Jan. 21, 1997

[30] Foreign Application Priority Data

Aug. 8, 1996 [JP] Japan .................................. 8-208719

[51] Int. Cl.[6] .................. H01L 31/0328; H01L 31/0336
[52] U.S. Cl. ............................................ 257/192; 257/194
[58] Field of Search ............................. 257/192, 194, 257/26, 27, 29

[56] References Cited

U.S. PATENT DOCUMENTS

| | | | |
|---|---|---|---|
| 5,038,187 | 8/1991 | Zhou | 257/194 |
| 5,404,032 | 4/1995 | Sawada et al. | 257/194 |
| 5,504,353 | 4/1996 | Kuzuhara | 257/194 |
| 5,521,404 | 5/1996 | Kikkawa et al. | 257/194 |

FOREIGN PATENT DOCUMENTS

| | | |
|---|---|---|
| 6130259 | 4/1994 | Japan . |
| 6140435 | 5/1994 | Japan . |

OTHER PUBLICATIONS

Iwata et al., "2.2 V Operation Power Heterojunction FET For Personal Digital Cellular Telephones", Electronics Letters, vol. 31, No. 25, 1995, pp. 2213–2215.

*Primary Examiner*—Wael Fahmy
*Attorney, Agent, or Firm*—Leydig, Voit & Mayer, Ltd.

[57] ABSTRACT

A field effect transistor includes a semi-insulating semiconductor substrate; a buffer layer disposed on the substrate and having a high resistance; a first semiconductor layer disposed on the buffer layer and having a relatively high concentration of a dopant impurity; a second semiconductor layer disposed on the first semiconductor layer and having a relatively low concentration of a dopant impurity; a third semiconductor layer disposed on the second semiconductor layer and having a relatively high concentration of a dopant impurity; a fourth semiconductor layer disposed on the third semiconductor layer; and a gate electrode, a source electrode, and a drain electrode disposed on the fourth semiconductor layer wherein the electron affinity of the second semiconductor layer is larger than that of the first and third semiconductor layers, and the difference between the electron affinities of the first and second semiconductor layers proximate their junction is larger than the difference between the electron affinities of the second and third semiconductor layers proximate their junction. The linearity of an output signal with respect to an input signal is improved so that the field effect transistor has improved distortion characteristics and reduced noise on adjacent lines in frequency multiplexed communication.

9 Claims, 13 Drawing Sheets

5,739,558

HIGH ELECTRON MOBILITY TRANSISTOR INCLUDING ASYMMETRICAL CARRIER SUPPLY LAYERS SANDWICHING A CHANNEL LAYER

FIELD OF THE INVENTION

The present invention relates to a field effect transistor and, more particularly, to a high-power, high-efficiency field effect transistor with improved distortion characteristics.

BACKGROUND OF THE INVENTION

In line with digitalization of communication systems, a small-sized, high-power, and high-efficiency transistor having smaller leakage power to adjacent lines, i.e., smaller distortion is needed as an output stage transistor for communication apparatus.

Generally, an output signal $V_0(t)$ of a transistor can be represented by $$V_0(t) = \sum_{n=0}^{\infty} a_n V_i^n(t) \quad (1)$$

wherein an input signal is $V_i(t)$.

Here, when as an input signal $V_i(t)$, a frequency multiplexed signal comprising a signal having a fundamental frequency $f_1$ and a signal having a fundamental frequency $f_2$, that is, $$V_i(t) = A_1 \cos(2\pi f_1 t) + A_2 \cos(2\pi f_2) t, \quad (2)$$

is employed, the signal components of adjacent frequencies which are represented by $f_0 = 2 f_1 - f_2$, $f_3 = 2 f_2 - f_1$ as tertiary components of the formula (1) produce the most disturbing signal components. These signal components are called tertiary intermodulation distortion (IMD3). This IMD3 occurs due to non-linearity of an amplifier or the like between input and output, functioning as a noise on the adjacent lines. Therefore, in a communication using plural circuits (frequency multiplex communication), in order on reduce such an influence to adjacent lines, a high-power, high-efficiency transistor with improved distortion characteristics, that is, improved linearity between an input and an output is requested.

Recently, in order to obtain a high output, high efficiency characteristics, a high electron mobility transistor (hereinafter referred to as HEMT) having a double-heterojunction (DH) as shown in FIG. 10, is expected to be a promising device which has higher power-output and higher efficiency characteristics than before (For example, refer to Electronics Lett. 31 (1995) p. 2213).

A brief description is given of a method of fabricating a conventional HEMT.

First of all, on a surface of a semi-insulating GaAs substrate 100, an undoped $Al_{0.2}Ga_{0.8}As$/undoped GaAs superlattice buffer layer 101, an undoped $Al_{0.2}Ga_{0.8}As$ buffer layer 102, an n type $Al_{0.2}Ga_{0.8}As$ lower carrier supplying layer 103a, an undoped $Al_{0.2}Ga_{0.8}As$ lower spacer layer 104a, an undoped $In_{0.15}Ga_{0.85}As$ channel layer 105, an undoped $Al_{0.2}Ga_{0.8}As$ upper spacer layer 104b, an n type $Al_{0.2}Ga_{0.8}As$ upper carrier supplying layer 103b, an undoped $Al_{0.2}Ga_{0.8}As$ Schottky junction forming layer 106, an n type GaAs lower contact layer 107, an n type $Al_{0.2}Ga_{0.8}As$ etch stopping layer 108, and an $n^+$ type GaAs upper contact layer 109 are laminated in this order by a crystal growth method such as MBE or MOCVD. These respective layers form a DH structure where carrier supplying layers (103a, 103b) sandwiching the channel layer have the same Al composition.

Thereafter a source electrode 111 and a drain electrode 112 are formed, and recessed structures as shown in FIG. 10 are formed by conventional photolithography, followed by a production of a gate electrode 110, thereby completing the field effect transistor.

Next, a description is given of characteristics of a HEMT fabricated by the above-described method.

FIG. 11 is an energy band diagram at a lower edge of a conduction band in the HEMT shown in FIG. 10, and FIG. 12 is a graph illustrating a drain current Id and a drain conductance gm with respect to a gate voltage Vg of the HEMT having a gate length Lg of 0.7 µm and a gate width Wg of 200 µm, as shown in FIG. 10.

In the energy band of the HEMT shown in FIG. 10, the upper heterojunction barrier height is equal to the lower heterojunction barrier height, as shown in FIG. 11. Moreover, as the characteristics of the HEMT, the drain current Id (output) with respect to the gate voltage Vg (input) is inferior in linearity as shown in FIG. 12, and there is almost no portion where the drain conductance gm, which is represented by the value ($\partial Id/\partial Vg$) that is obtained by dividing the variation of the drain current by the variation of the gate voltage, has a constant value in a certain range of Vg.

Thus, this prior art HEMT is inferior in linearity between input and output, i.e., has inferior distortion characteristics, and the tertiary intermodulation distortion (IMD3) is large, resulting in a larger leakage of signals to adjacent lines in frequency multiplexed communication.

SUMMARY OF THE INVENTION

It is an object of the present invention to provide a field effect transistor having improved distortion characteristics and reduced leakage power to adjacent lines by widening a range in which the drain conductance has a constant value with respect to the gate input voltage.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a first aspect of the present invention, a field effect transistor comprises: a semi-insulating semiconductor substrate having a surface; a buffer layer disposed on the semiconductor substrate and having a high resistance; a first semiconductor layer disposed on the buffer layer and having a relatively high concentration of impurity; a second semiconductor layer disposed on the first semiconductor layer and having no or a relatively low concentration of impurity; a third semiconductor layer disposed on the second semiconductor layer and having a relatively high concentration of impurity; a fourth semiconductor layer disposed on the third semiconductor layer and comprising a gate electrode, a source electrode, and a drain electrode disposed on the surface. In the field effect transistor, an electron affinity of a material of the second semiconductor layer is larger than an electron affinity of materials of the first semiconductor layer and the third semiconductor layer, and the difference between the electron affinity of the first semiconductor layer and that of the second semiconductor layer in a vicinity of the junction between the first and second semiconductor layers is larger than the difference between the electron affinity of the second semiconductor layer and that of the third semiconductor layer in a vicinity of the junction between the second and third semiconductor layers. As a result, since a lower heterojunction barrier height is higher than an upper heterojunction barrier height, a linearity of an output signal with respect to an input signal is improved, thereby obtaining a field effect transistor which has improved distortion characteristics and reduced noise to adjacent lines in frequency multiplex communication.

According to a second aspect of the present invention, in the field effect transistor of the first aspect, the electron affinity of the material of the first semiconductor layer is smaller than that of the material of the third semiconductor layer. As a result, since the lower heterojunction barrier height is higher than the upper heterojunction barrier height, a linearity of an output signal with respect to an input signal is improved, thereby obtaining a field effect transistor which has improved distortion characteristics and reduced noise to the adjacent lines in frequency multiplex communication.

According to a third aspect of the present invention, in the field effect transistor of the first aspect, the electron affinity of the material of the second semiconductor layer is gradually reduced in a vertical direction from the first semiconductor layer to the third semiconductor layer. As a result, the height of the lower heterobarrier becomes higher than the height of the upper heterobarrier, and a linearity of an output signal with respect to an input signal is improved, thereby obtaining a field effect transistor which has improved distortion characteristics and reduced noise to adjacent lines in frequency multiplex communication.

According to a fourth aspect of the present invention, in the field effect transistor of the second aspect, the first semiconductor layer and the third semiconductor layer comprise AlGaAs, and an Al composition of the first semiconductor layer is higher than that of the third semiconductor layer. As a result, it is possible to obtain a high electron mobility transistor with improved distortion characteristics where a lower heterojunction barrier height is higher than an upper heterojunction barrier height.

According to a fifth aspect of the present invention, in the field effect transistor of the second aspect, the first semiconductor layer and the third semiconductor layer comprise InGaP, and a Ga composition of the first semiconductor layer is higher than that of the third semiconductor layer. As a result, it is possible to obtain a high electron mobility transistor with improved distortion characteristics where a lower heterojunction barrier height is higher than an upper heterojunction barrier height.

According to a sixth aspect of the present invention, in the field effect transistor of the second aspect, the first semiconductor layer and the third semiconductor layer comprise AlInAs, and an Al composition of the first semiconductor layer is higher than that of the third semiconductor layer. As a result, it is possible to obtain a high electron mobility transistor with improved distortion characteristics where a lower heterojunction barrier height is higher than an upper heterojunction barrier height.

According to a seventh aspect of the present invention, in the field effect transistor of the third aspect, the second semiconductor layer comprise InGaAs, and an In composition of the second semiconductor layer is reduced gradually or in stages in a vertical direction from the first semiconductor layer to the third semiconductor layer. As a result, it is possible to obtain a high electron mobility transistor with improved distortion characteristics where a lower heterojunction barrier height is higher than an upper heterojunction barrier height.

DETAILED DESCRIPTION OF THE PREFERRED EMBODIMENTS

Embodiment 1

Figure 1:
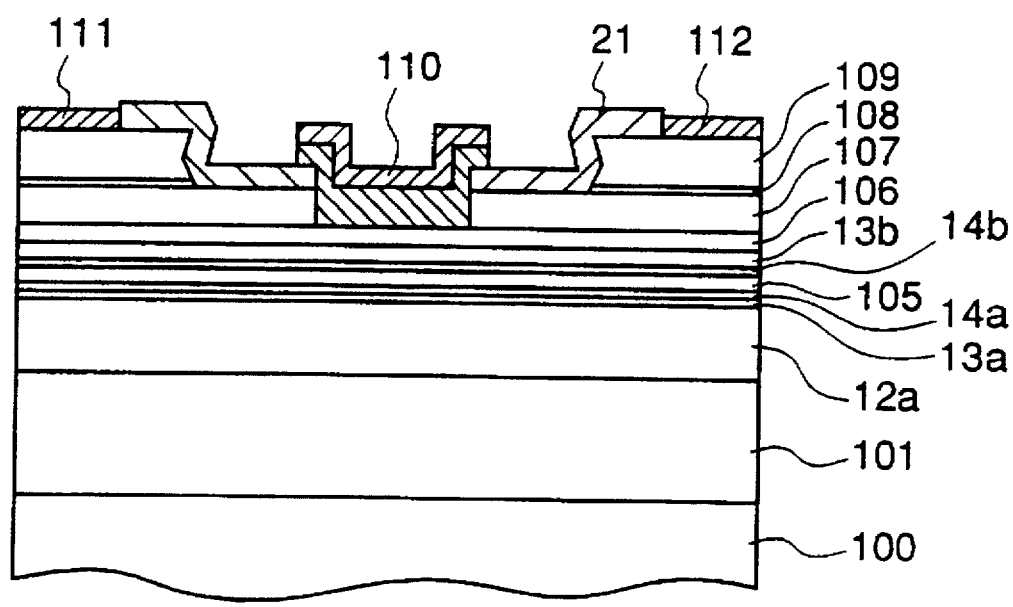
FIG. 1 is a cross-sectional view illustrating a field effect transistor in accordance with a first embodiment of the present invention.
Figure 2:
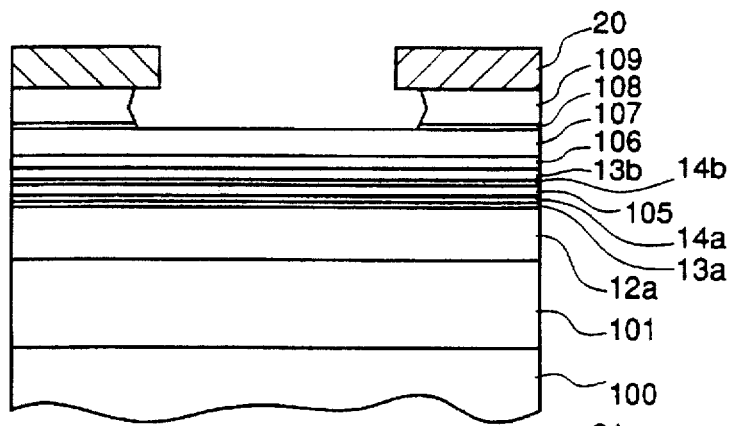
FIGS. 2(a)–2(d) are cross-sectional views schematically illustrating process steps in a method for fabricating a field effect transistor in accordance with the first embodiment of the present invention.
Figure 2:
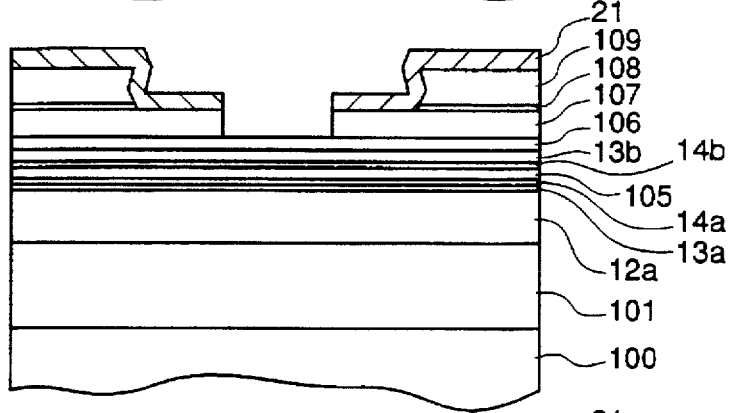
Figure 2:
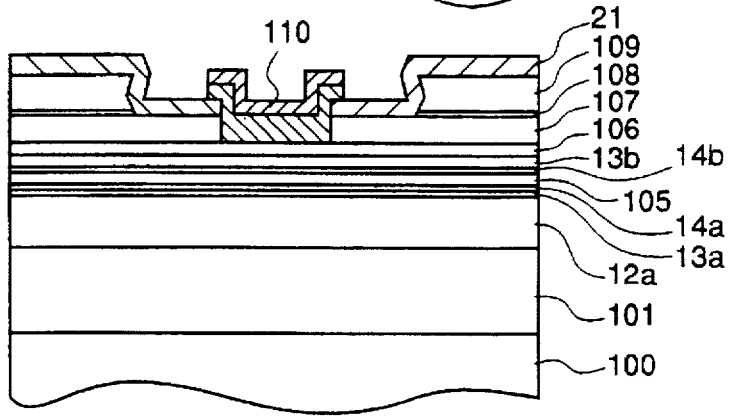
Figure 2:
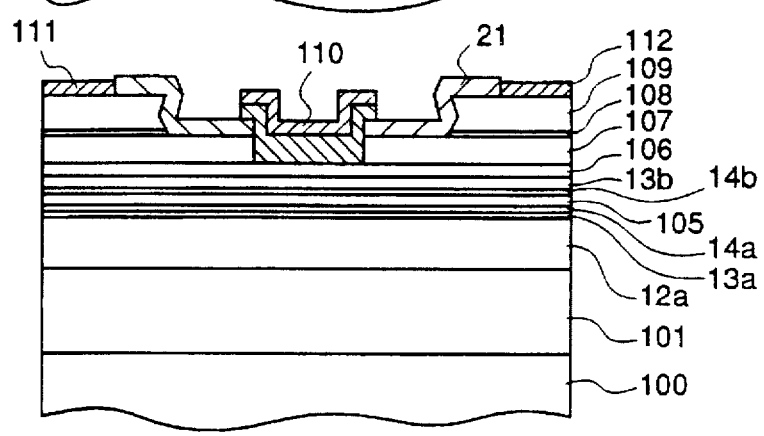
Figure 10:
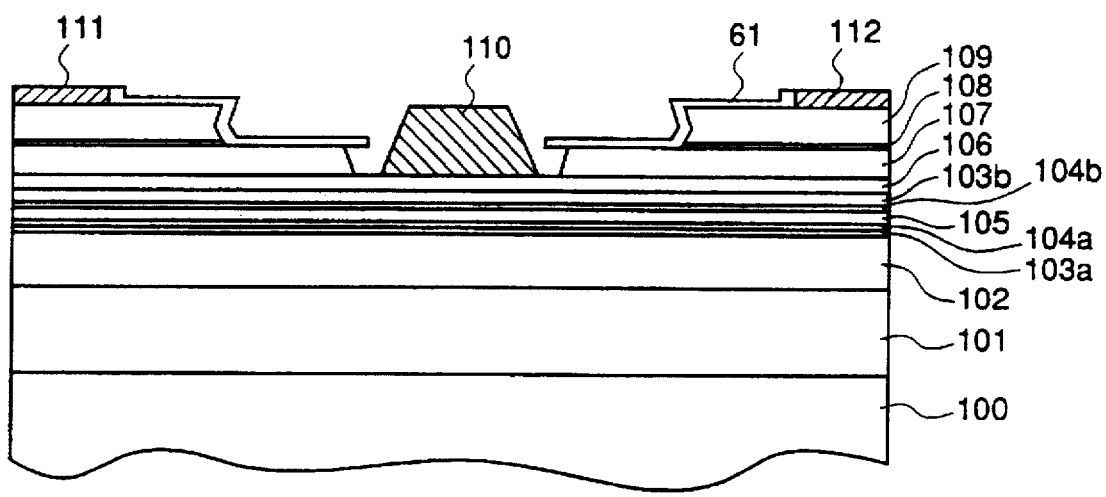
FIG. 10 is a cross-sectional view schematically illustrating a prior art field effect transistor.
Figure 11:
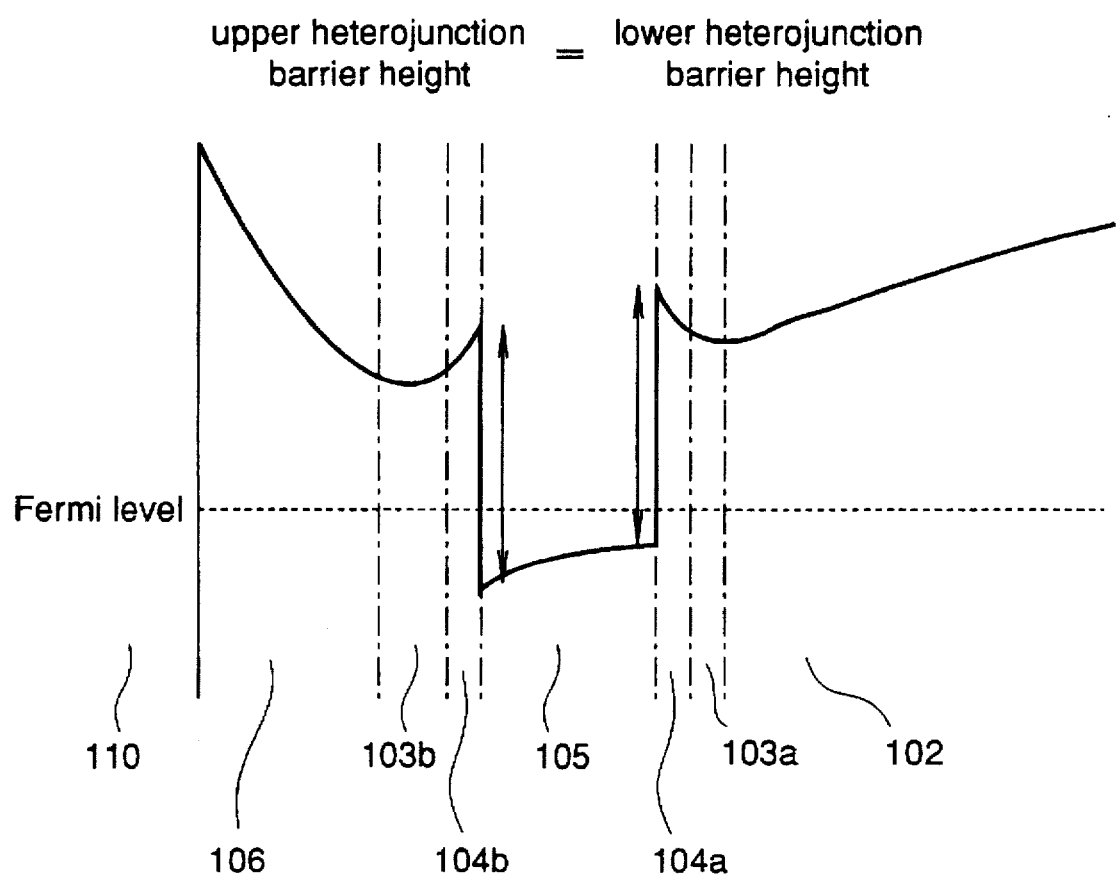
FIG. 11 is an energy band diagram at a lower edge of a conduction band in the prior art field effect transistor.

FIG. 1 is a cross-sectional view schematically illustrating a field effect transistor in accordance with a first embodiment. In the figure, reference numeral 100 designates a semi-insulating GaAs substrate, numeral 101 designates an undoped $Al_{0.2}Ga_{0.8}As$/undoped GaAs superlattice buffer layer disposed on the semi-insulating GaAs substrate 100 and having a layer thickness of 8000 Å, numeral 12a designates an undoped $Al_xGa_{1-x}As$ buffer layer disposed on the superlattice buffer layer 101 and having a layer thickness of 2000 Å, numeral 13a designates an n type $Al_xGa_{1-x}As$ lower carrier supplying layer disposed on the buffer layer 12a and having a layer thickness of 50 Å, and comprising Si, Se, or the like as an impurity at an impurity concentration of $3\times10^{18}$ cm$^{-3}$, numeral 14a designates an undoped $Al_xGa_{1-x}As$ lower spacer layer disposed on the lower carrier supplying layer 13a and having a layer thickness of 30 Å, numeral 105 designates an undoped $In_zGa_{1-z}As$ channel layer disposed on the lower spacer layer 14a and having a layer thickness of 200 Å, numeral 14b designates an undoped $Al_yGa_{1-y}As$ upper spacer layer disposed on the channel layer 105 and having a layer thickness of 30 Å, numeral 13b designates an n type $Al_yGa_{1-y}As$ upper carrier supplying layer disposed on the upper spacer layer 14b and having a layer thickness of 100 Å, and comprising Si, Se, or the like as an impurity at an impurity concentration of $3 \times 10^{18}$ cm$^{-3}$, numeral 106 designates an undoped $Al_yGa_{1-y}As$ Schottky junction forming layer disposed on the upper carrier supplying layer 13b and having a layer thickness of 200 Å, numeral 107 designates an n type GaAs lower contact layer disposed on the Schottky junction forming layer 106 and having a layer thickness of 1000 Å, and comprising Si, Se, or the like as an impurity at an impurity concentration of $5 \times 10^{16}$ cm$^{-3}$, numeral 108 designates an n type $Al_{0.2}Ga_{0.8}As$ etch stopping layer disposed on the lower contact layer 107 and having a layer thickness of 10 Å, numeral 109 designates an n$^+$ type GaAs contact layer disposed on the etch stopping layer 108 and having a layer thickness of 2000 Å, and comprising Si, Se, or the like as an impurity at an impurity concentration of $2 \times 10^{18}$ cm$^{-3}$ numeral 110 designates a source electrode, numeral 111 designates a drain electrode, and numeral 112 designates a gate electrode. In the figure, the same reference numerals shown in FIG. 10 designate the same or corresponding parts.

The values of x, y, z (0<x, y, z<1), which indicate the component ratios of the respective materials, are desired to have a relationship that $0.1<y<x<0.4$ and $0<z<0.25$ so that the degree of the lattice mismatching is not so large and an Al composition (x) of the n type $Al_xGa_{1-x}As$ lower carrier supplying layer 13a is higher than an Al composition (y) of the n type $Al_yGa_{1-y}As$ upper carrier supplying layer 13b (x>y). In the first embodiment, x=0.3, y=0.2, z=0.15 in view of the transistor characteristics.

A description is given of a method of fabricating the field effect transistor according to the first embodiment.

FIGS. 2(a) to 2(d) are cross-sectional views schematically showing process steps in a method for fabricating the field effect transistor shown in FIG. 1. In the figure, the same reference numerals shown in FIG. 1 and 10 designate the same or corresponding parts.

First of all, an undoped $Al_{0.2}Ga_{0.8}As$/undoped GaAs superlattice buffer layer 101, an undoped $Al_xGa_{1-x}As$ buffer layer 12a, an n type $Al_xGa_{1-x}As$ lower carrier supplying layer 13a, an undoped $Al_xGa_{1-x}As$ lower spacer layer 14a, an undoped $In_zGa_{1-z}As$ channel layer 105, an undoped $Al_yGa_{1-y}As$ upper spacer layer 14b, an n type $Al_yGa_{1-y}As$ upper carrier supplying layer 13b, an undoped $Al_yGa_{1-y}As$ Schottky junction forming layer 106, an n type GaAs lower contact layer 107, an n type $Al_{0.2}Ga_{0.8}As$ etch stopping layer 108, an n$^+$ type GaAs contact layer 109 are successively laminated on a semi-insulating GaAs substrate 100 by a crystal growth method such as MBE or MOCVD.

Next, a resist is formed on a surface of the uppermost n$^+$ type GaAs contact layer 109, and subsequently partially removed by photolithography to form a resist mask 20 having an opening opposite a region where a first recess is later formed. Using the resist mask as an etching mask, selective etching is performed with an etchant comprising citric acid and aqueous hydrogen peroxide mixed in a ratio of 4:1 until the etching front reaches the etch stopping layer 108. Thereafter, the etch stopping layer 108 is partly removed using the same resist mask as an etching mask, resulting in the first recess as shown in FIG. 2(a).

Next, after removal of the resist mask 20, an insulating film is formed on the entire surface. Then, a resist (not shown) is deposited over the insulating mask and subsequently partially removed by photolithography to form a resist mask having an opening in a region where a second recess is formed later. Using the resist mask as an etching mask, the insulating mask is removed to form an insulating film 21 having an opening opposite the region where the second recess is formed. After removal of the resist, using this insulating film 21 as a mask, selective etching is performed with an etchant comprising citric acid and aqueous hydrogen peroxide mixed in a ratio of 4:1 until the etching front reaches the Schottky junction forming layer 106. As a result, the lower contact layer 107 is removed by the etching, resulting in the second recess as shown in FIG. 2(b).

Next, WSi and Au are successively laminated on the entire surface by sputtering or the like, and a resist is formed over the entire surface and subsequently partially removed by photolithography leaving a portion of the resist on a region where a gate electrode is formed later (not shown). After removal of Au and WSi by milling and RIE using this resist as a mask, the resist is removed, and then annealing is performed for restoration of the surface damaged by etching, resulting in a gate electrode 110 shown in FIG. 2(c).

Next, a resist is formed over the entire surface and subsequently partially removed by photolithography to form a mask having openings opposite regions where a source electrode and a drain electrode are formed later, and portions of the insulating film 21 opposite these regions are removed. Afterward, an electrode metal is deposited by evaporation or the like, and the resist is removed to form the source electrode 111 and the drain electrode 112, whereby the field effect transistor is completed.

A description is given of the operation and the effects of the field effect transistor according to the first embodiment.

Figure 3:
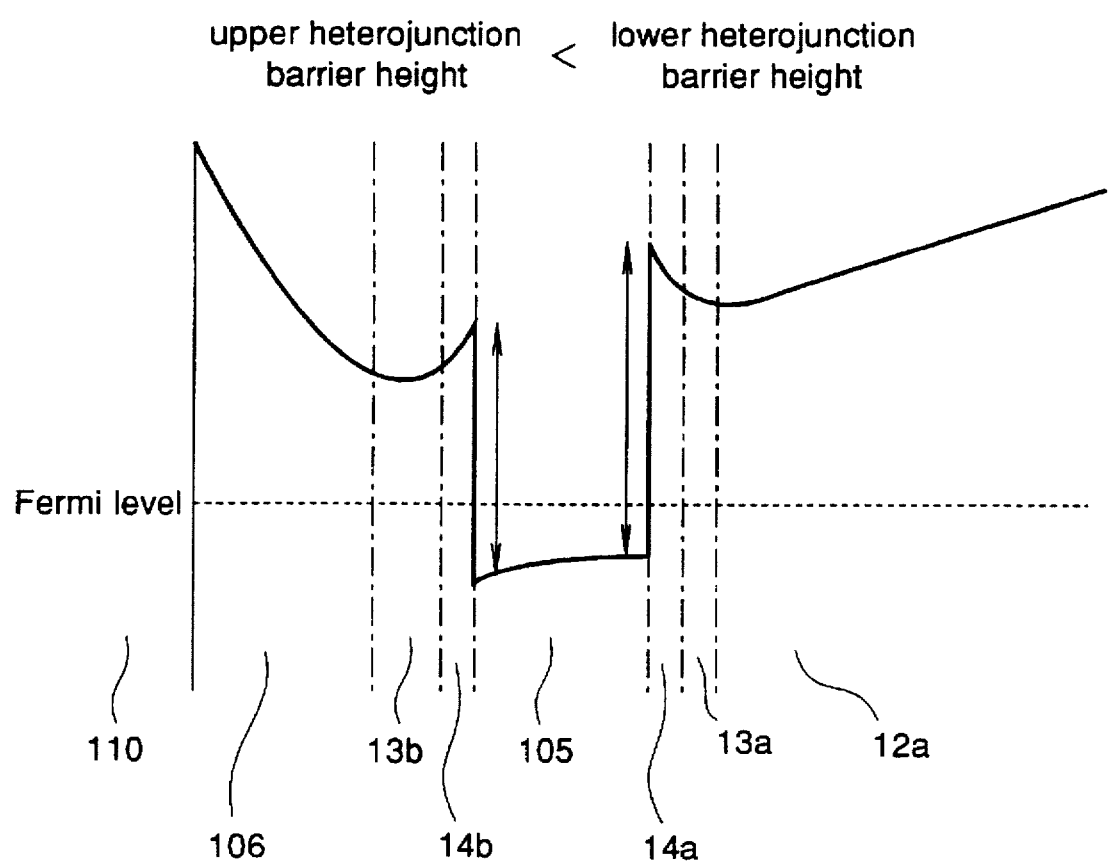
FIG. 3 is an energy band diagram at a lower edge of a conduction band in a field effect transistor in accordance with the first embodiment of the present invention.
Figure 4:
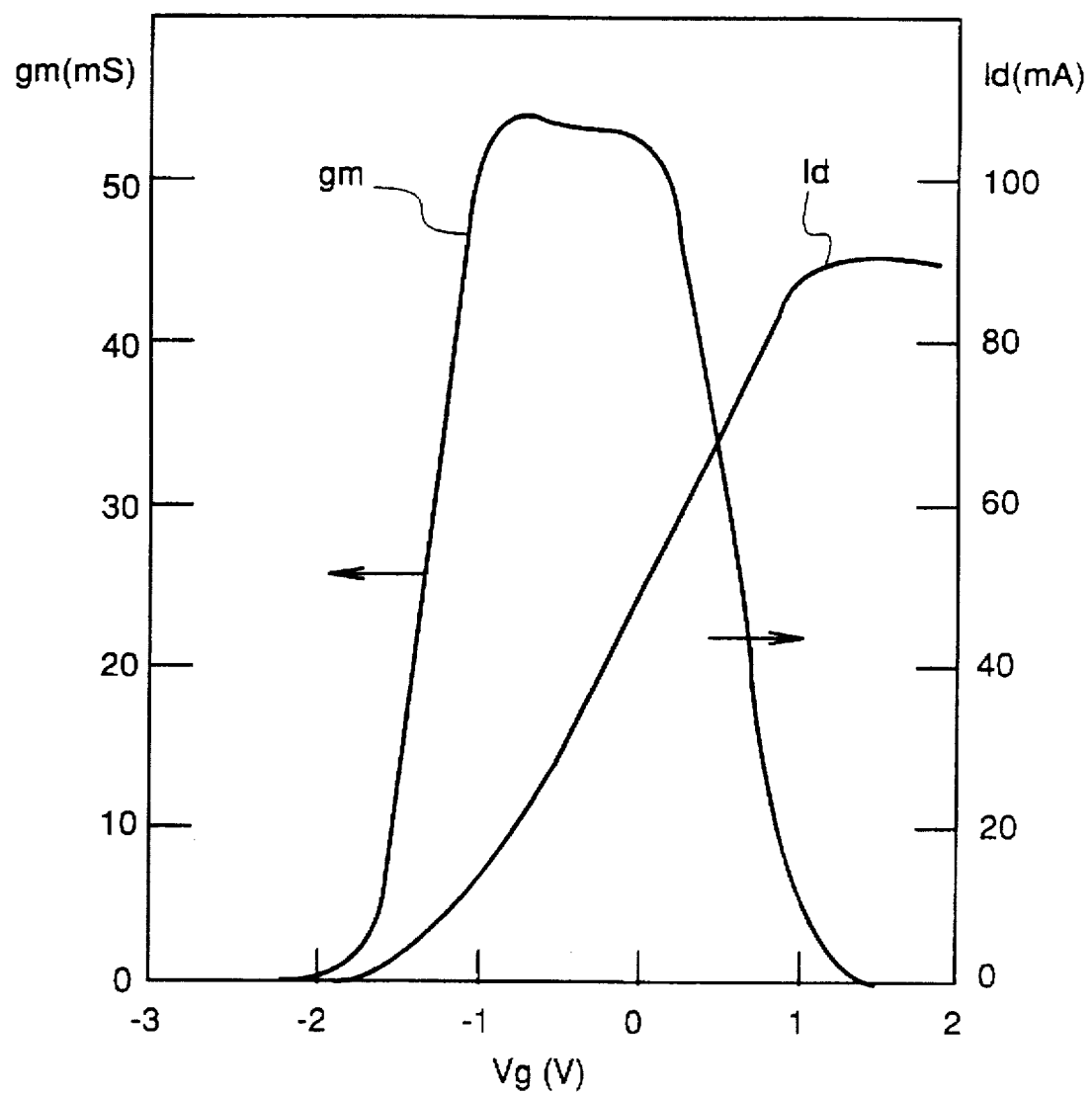
FIG. 4 is a diagram illustrating DC characteristics of a field effect transistor in accordance with the first embodiment of the present invention.

FIG. 3 is an energy band diagram at a lower edge of a conduction band in the field effect transistor of the first embodiment, and FIG. 4 is a graph of a drain current Id and a drain conductance gm of the field effect transistor (the gate length Lg=0.7 µm, the gate width Wg=200 µm) where a lower heterojunction barrier height is higher than an upper heterojunction barrier height as shown in FIG. 3.

The inventors found from their experimental data that when the heterojunction barrier height between the lower carrier supplying layer (the lower spacer layer) and the channel layer is higher than the heterojunction barrier height between the upper carrier supplying layer (the upper spacer layer) and the channel layer, the linearity in the DC characteristics of the field effect transistor is improved, that is, a field effect transistor with improved, i.e., reduced distortion characteristics is obtained. Therefore, in the first embodiment, the lower carrier supplying layer (the lower spacer layer) comprises a material whose electron affinity is smaller than that of the upper carrier supplying layer (the upper spacer layer) in order to obtain a field effect transistor having such a structure where the lower heterojunction barrier height is higher than the upper heterojunction barrier height.

A heterojunction barrier height is determined by a difference between the electron affinity of the channel layer 105 and the electron affinity of the upper carrier supplying layer 13b (the upper spacer layer 14b), or a difference between the electron affinity of the channel layer 105 and the electron affinity of the lower carrier supplying layer 13a (the lower spacer layer 14a). Moreover, electron affinity indicates an energy difference between a lower edge of a conduction band and a vacuum level, and an electron affinity of a ternary compound semiconductor can be obtained from table 1 using Vegard's Law.

TABLE 1

|  | Electron Affinity [eV] |
|---|---|
| AlAs | 2.62 |
| GaAs | 4.07 |
| InP | 4.40 |
| GaP | 4.0 |
| InAs | 4.90 |

Using this table, for example, the electron affinity of AlGaAs can be obtained by summing the product of the electron affinity of AlAs (2.62) and the Al composition x and the product of the electron affinity of GaAs (4.07) and the Ga composition 1-x. Therefore, when the upper and lower carrier supplying layers (the spacer layers) comprise AlGaAs, since the electron affinity of the material can be obtained by the use of the Vegard's Law, the lower carrier supplying layer can be formed with a material whose Al composition is larger than that of the upper carrier supplying layer, thereby realizing the field effect transistor where a lower heterojunction barrier height is higher than the upper heterojunction barrier height. When InGaP is used for the upper and lower carrier supplying layers (spacer layers), the material whose Ga composition is larger than that of a material for the upper carrier supplying layer is used for the lower carrier supplying layer. When AlInAs is used for these carrier supplying layers, a material whose Al composition is larger than that of the material of the upper carrier concentration is used for the lower carrier supplying layers.

Figure 12:
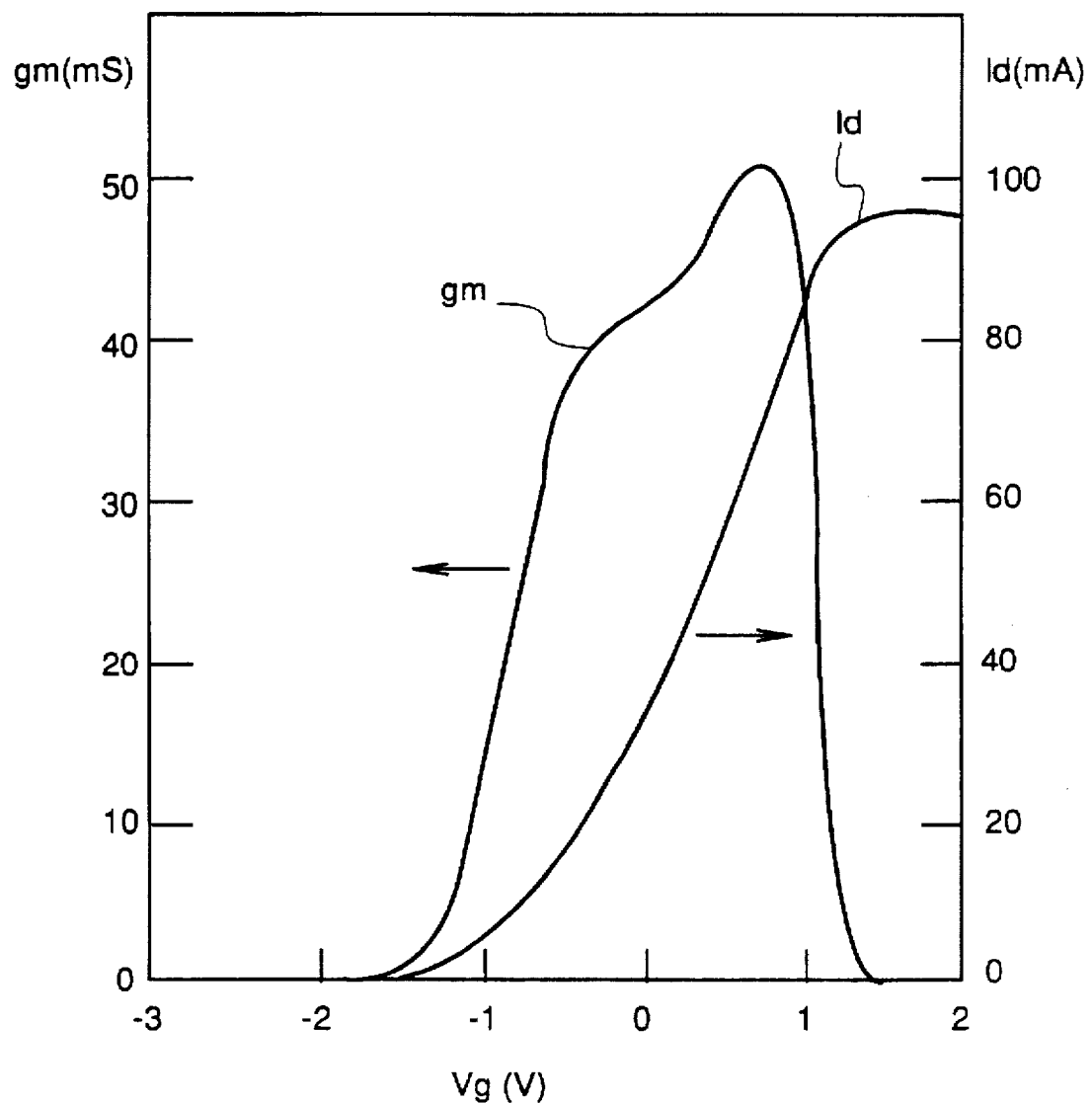
FIG. 12 is a diagram illustrating DC characteristics of the prior art field effect transistor.

When comparing the DC characteristics (shown in FIG. 4) of the field effect transistor where the lower heterojunction barrier height is higher than the upper heterojunction barrier height and the DC characteristics (shown in FIG. 12) of the field effect transistor where the lower heterojunction barrier height is equal to the upper heterojunction barrier height, the graph of the drain conductance gm in FIG. 12 shows that the low Id (output) region is inferior in linearity and there is almost no portion where the drain conductance gm has a constant value in a certain region of Vg. On the other hand, the graph of the drain conductance gm in FIG. 4 shows that the value of gm in the low Id (output) region is higher than the value of gm in the low Id region in FIG. 12, and the gm has an approximately constant value in the region of Vg from −1 V to 0 V. In other words, in comparison with the conventional field effect transistor (FIG. 12), the field effect transistor of the first embodiment (FIG. 4) has an improved linearity in the DC characteristics, resulting in improved distortion characteristics.

As described above, according to the first embodiment, the Al composition x of the n type $Al_xGa_{1-x}As$ lower carrier supplying layer 13a is larger than the Al composition y of the n type $Al_yGa_{1-y}As$ upper carrier supplying layer 13b, and the electron affinity of the lower carrier supplying layer 13a is smaller than the electron affinity of the upper carrier supplying layer 13b. As a result, the lower heterojunction barrier height is higher than the upper heterojunction barrier height, thereby producing a field effect transistor which has improved distortion characteristics and reduced leakage to adjacent lines in frequency multiplexed communication.

The field effect transistor of the first embodiment has a buried gate structure. Therefore, since the time during which the surfaces of the recesses are exposed to the process ambient in the fabrication process can be reduced, elements having more stable surface levels can be fabricated, resulting in a transistor with improved reliability.

Embodiment 2

In a second embodiment, a field effect transistor comprises materials different from the materials of the transistor of the first embodiment, and the electron affinity of a lower carrier supplying layer (a lower spacer layer) is smaller than that of an upper carrier supplying layer (an upper spacer layer). In addition, the field effect transistor of the second embodiment has a gate electrode and recesses whose shapes are different from those of the first embodiment.

Figure 5:
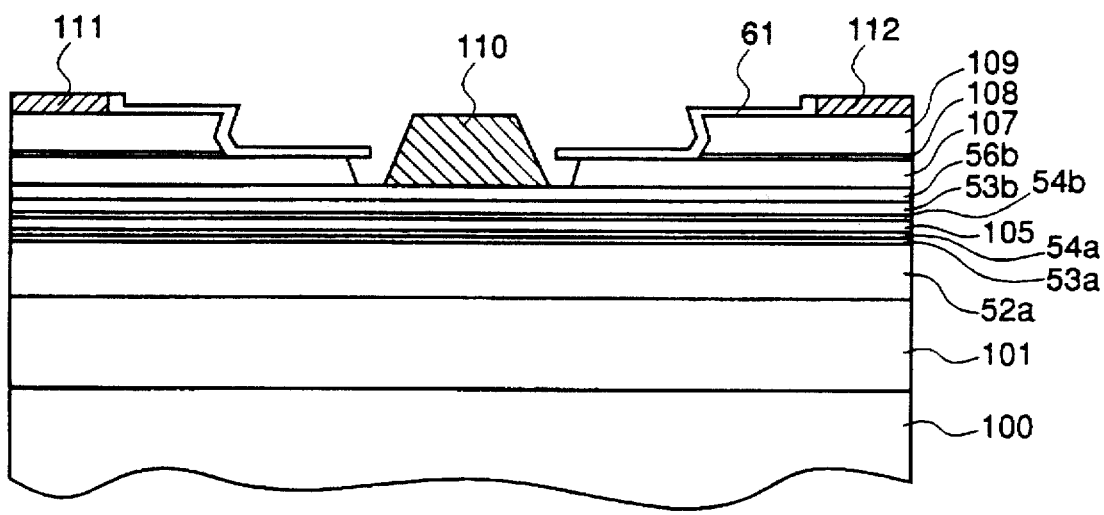
FIG. 5 is a cross-sectional view schematically illustrating a field effect transistor in accordance with a second embodiment of the present invention.

FIG. 5 is a cross-sectional view schematically illustrating a structure of the field effect transistor in accordance with the second embodiment. In the figure, reference numeral 100 designates a semi-insulating GaAs substrate, numeral 101 designates an undoped $Al_{0.2}Ga_{0.8}As$/undoped GaAs superlattice buffer layer disposed on the semi-insulating GaAs substrate 100 and having a layer thickness of 8000 Å, numeral 52a designates an undoped $In_{1-x}Ga_xP$ buffer layer disposed on the superlattice buffer layer 101 and having a layer thickness of 2000 Å, numeral 53a designates an n type $In_{1-x}Ga_xP$ lower carrier supplying layer disposed on the buffer layer 52a and having a layer thickness of 50 Å, and comprising Si, Se, or the like as an impurity at an impurity concentration of $3\times10^{18}$ cm$^{-3}$, numeral 54a designates an undoped $In_{1-x}Ga_xP$ lower spacer layer disposed on the lower carrier supplying layer 53a and having a layer thickness of 30 Å, numeral 105 designates an undoped $In_zGa_{1-z}As$ channel layer disposed on the lower spacer layer 54a and having a layer thickness of 200 Å, numeral 54b designates an undoped $In_{1-y}Ga_yP$ upper spacer layer disposed on the channel layer 105 and having a layer thickness of 30 Å, numeral 53b designates an n type $In_{1-y}Ga_yP$ upper carrier supplying layer disposed on the upper spacer layer 54b and having a layer thickness of 100 Å, and comprising Si, Se, or the like as an impurity at an impurity concentration of $3\times10^{18}$ cm$^{-3}$, numeral 56b designates an undoped $In_{1-y}Ga_yP$ Schottky junction forming layer disposed on the upper carrier supplying layer 53b and having a layer thickness of 200 Å, numeral 107 designates an n type GaAs lower contact layer disposed on the Schottky junction forming layer 56b and having a layer thickness of 1000 Å, and comprising Si, Se, or the like as an impurity at an impurity concentration of $5\times10^{16}$ cm$^{-3}$, and numeral 108 designates an n type $Al_{0.2}Ga_{0.8}As$ etch stopping layer disposed on the lower contact layer 107 and having a layer thickness of 10 Å, numeral 109 designates an n$^+$ type GaAs contact layer disposed on the etch stopping layer 108 and having a layer thickness of 2000 Å, and comprising Si, Se, or the like as an impurity at an impurity concentration of $2\times10^{18}$ cm$^{-3}$, numeral 111 designates a source electrode, numeral 112 designates a drain electrode, and numeral 110 designates a gate electrode.

The values of x, y, z (0<x, y, z<1), which indicate the composition ratios of the respective materials, are desired to have a relationship that 0.4<y<x<0.7, and 0<z<0.25 so that the degree of the lattice mismatching is not so large, and the Ga composition (x) of the n type $In_{1-x}Ga_xP$ lower carrier supplying layer 53a is higher than the Ga composition (y) of the n type $In_{1-y}Ga_yP$ upper carrier supplying layer 53b (x>y). In the second embodiment, x=0.6, y=0.5, and z=0.15 in view of the transistor characteristics.

Figure 6:
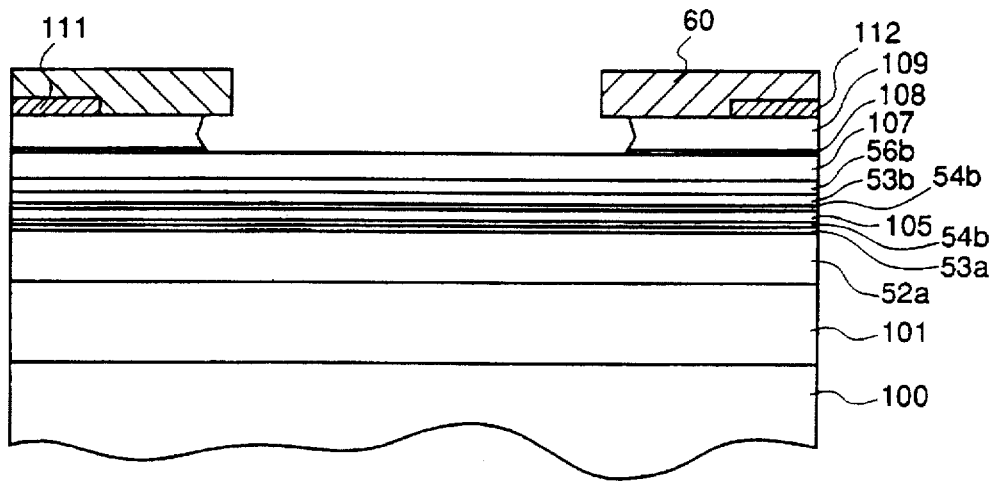
FIGS. 6(a)–6(c) are cross-sectional views schematically illustrating process steps in a method for fabricating a field effect transistor in accordance with the second embodiment of the present invention.
Figure 6:
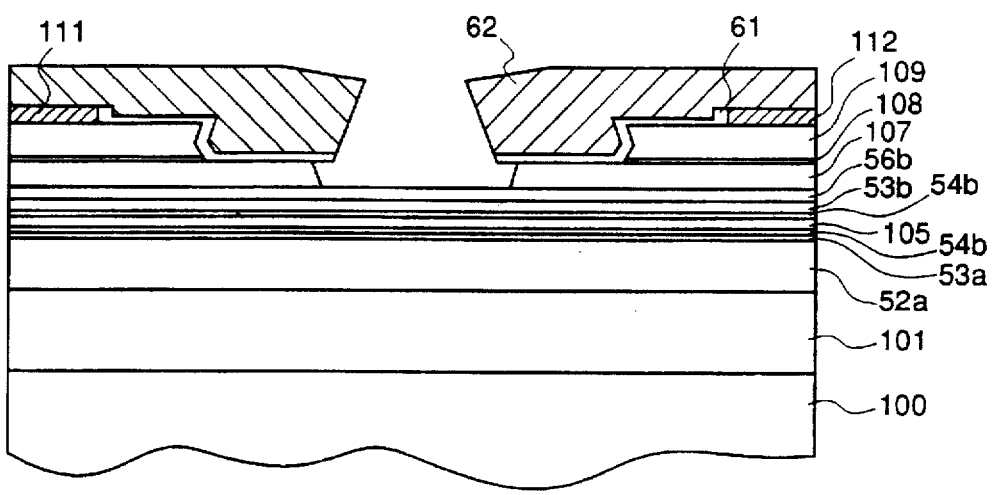
Figure 6:
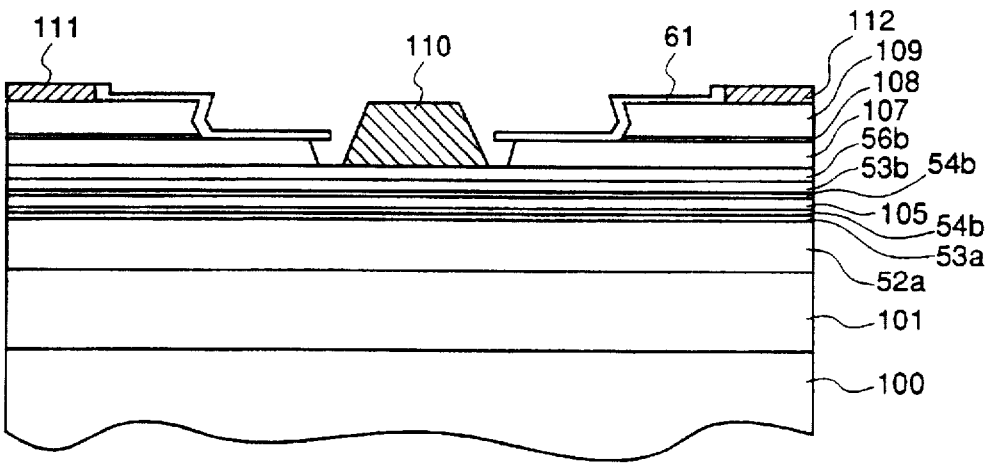

A description is given of the field effect transistor of the second embodiment. FIGS. 6(a) to 6(c) are cross-sectional views schematically showing process steps in a method for fabricating the field effect transistor shown in FIG. 5. In the figure, the same reference numerals shown in FIG. 1 designate the same or corresponding parts.

First of all, an undoped $Al_{0.2}Ga_{0.8}As$/undoped GaAs superlattice buffer layer 101, an undoped $In_{1-x}Ga_xP$ buffer layer 52a, an n type $In_{1-x}Ga_xP$ lower carrier supplying layer 53a, an undoped $In_{1-x}Ga_xP$ lower spacer layer 54a, an undoped $In_zGa_{1-z}As$ channel layer 105, an undoped $In_{1-y}Ga_yP$ upper spacer layer 54b, an n type $In_{1-y}Ga_yP$ upper carrier supplying layer 53b, an undoped $In_{1-y}Ga_yP$ Schottky junction forming layer 56b, an n type GaAs lower contact layer 107, an n type $Al_{0.2}Ga_{0.8}As$ etch stopping layer 108, and an n$^+$ type GaAs contact layer 109 are successively laminated on a semi-insulating GaAs substrate 100 by a crystal growth method such as MBE or MOCVD.

Then, on a surface of the uppermost n$^+$ type GaAs contact layer 109, an electrode metal is deposited on the entire surface by evaporation or the like and, on the entire surface of the electrode metal, a resist is formed and subsequently partially removed by photolithography leaving the portions opposite regions where a drain electrode are formed and a source electrode later, respectively. Using these remaining resists (not shown) as masks, an electrode metal is removed, and the resists are also removed to form a source electrode 111 and a drain electrode 112.

Next, a resist is formed on the entire surface and subsequently partially removed by photolithography to form a resist mask 60 having an opening opposite a region where a first recess is formed later. Using this resist mask as a mask, selective etching is performed using an etchant comprising citric acid and aqueous hydrogen peroxide mixed in a ratio of 4:1 until the etching front reaches the etch stopping layer 108. Afterward, the etch stopping layer 108 is removed using the same resist mask as an etching mask, resulting in a first recess as shown in FIG. 6(a).

After removal of this resist mask 60, an insulating film is formed on the entire surface, and a resist is applied to the insulating film and subsequently partially removed by photolithography to form a resist mask 62 having an opening opposite a region where a second recess is formed later. Using this resist mask as a mask, the insulating film is selectively removed to form an insulating film 61 having an opening opposite the region where a second recess is formed later. Afterward, selective etching is performed using an etchant comprising citric acid and aqueous hydrogen peroxide mixed in a ratio of 4:1, or an etchant comprising tartaric acid and aqueous hydrogen peroxide mixed in a ratio of 50:1 until the etching front reaches the Schottky junction forming layer 56b. As a result, the lower contact layer 107 is removed, resulting in a second recess as shown in FIG. 6(b).

Next, with the resist 62 still remaining, WSi and Au are successively laminated on the entire surface by sputtering, and the resist 62 is removed by the lift-off technique to form a gate electrode 110 as shown in FIG. 6(c), whereby the field effect transistor is completed.

While in the second embodiment a gate electrode is formed by laminating WSi and Au, the gate electrode also can be formed by successively laminating Ti/Al/Mo, Ti/Pt/Au, or Mo/Al/Mo, and any structure which makes a good connection with the Schottky junction forming layer is applicable.

As described above, in the second embodiment, the Ga composition x of the n type $In_{1-x}Ga_xP$ lower carrier supplying layer 53a is larger than the Ga composition y of the n type $In_{1-y}Ga_yP$ upper carrier supplying layer 53b, and the electron affinity of the lower carrier supplying layer 53b is smaller than the electron affinity of the upper carrier supplying layer 53b. Therefore, a field effect transistor where a lower heterojunction barrier height is higher than an upper heterojunction barrier height can be produced as in the first embodiment, thereby providing a field effect transistor having improved distortion characteristics.

The field effect transistor of the second embodiment has a two-stage recessed structure. Therefore, a high breakdown voltage can be obtained without degrading the performance of the transistor.

Embodiments 3 and 4

In third and fourth embodiments of the present invention, a field effect transistor comprises materials different from those of the field effect transistor of the first and second embodiments, and the electron affinity of a lower carrier supplying layer (a lower spacer layer) is smaller than that of an upper carrier supplying layer (an upper spacer layer). The field effect transistor of the third embodiment has a two-stage recessed structure identical to that of the second embodiment, and the field effect transistor of the fourth embodiment comprises a buried gate structure identical to that of the first embodiment.

Figure 7:
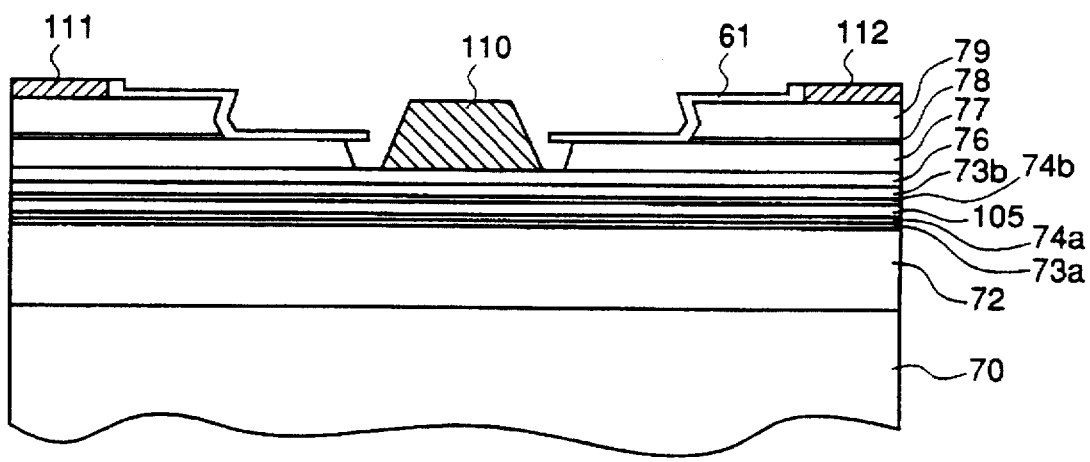
FIG. 7 is a cross-sectional view schematically illustrating a field effect transistor in accordance with a third embodiment of the present invention.

FIG. 7 is a cross-sectional view schematically showing a structure of the field effect transistor in accordance with the third and fourth embodiments. In the figure, reference numeral 70 designates a semi-insulating InP substrate, numeral 72 designates an undoped $Al_xIn_{1-x}As$ buffer layer disposed on the semi-insulating InP substrate 70 and having a layer thickness of 2500 Å, numeral 73a designates an n type $Al_xIn_{1-x}As$ lower carrier supplying layer disposed on the buffer layer 72 and having a layer thickness of 50 Å, and comprising Si, Se, or the like as an impurity at an impurity concentration of $3\times10^{18}$ cm$^{-3}$, numeral 74a designates an undoped $Al_xIn_{1-x}As$ lower spacer layer disposed on the lower carrier supplying layer 73a and having a layer thickness of 30 Å, numeral 105 designates an undoped $In_zGa_{1-z}As$ channel layer disposed on the lower spacer layer 74a and having a layer thickness of 200 Å, numeral 74b designates an undoped $Al_yIn_{1-y}As$ upper spacer layer disposed on the channel layer 105 and having a layer thickness of 30 Å, numeral 73b designates an n type $Al_yIn_{1-y}As$ upper carrier supplying layer disposed on the upper spacer layer 74b and having a layer thickness of 100 Å, and comprising Si, Se, or the like as an impurity at an impurity concentration of $3\times10^{18}$ cm$^{-3}$, numeral 76 designates an undoped $(Al_{1-s}Ga_s)_tIn_{1-t}As$ $(0<s<1, 0\leq t<1)$ Schottky junction forming layer disposed on the upper carrier supplying layer 73b and having a layer thickness of 200 Å, numeral 77 designates an n type $In_{0.53}Ga_{0.47}As$ lower contact layer disposed on the Schottky junction forming layer 76 and having a layer thickness of 1000 Å, and comprising Si, Se, or the like as an impurity at an impurity concentration of $5\times10^{16}$ cm$^{-3}$, numeral 78 designates an n type $In_{0.48}Ga_{0.52}P$ etch stopping layer disposed on the lower contact layer 77 and having a layer thickness of 10 Å, numeral 79 designates an n$^+$ type $In_{0.53}Ga_{0.47}As$ upper contact layer disposed on the etch stopping layer 78 and having a layer thickness of 2000 Å, and comprising Si, Se, or the like as an impurity at an impurity concentration of $2\times10^{18}$ cm$^{-3}$, numeral 110 designates a source electrode, numeral 111 designates a drain electrode, and numeral 112 designates a gate electrode. In the figure, the same reference numerals shown in FIG. 1 designate the same or corresponding parts.

The values of x, y, z, s, t ($0<x, y, z, s, t<1$), which indicate the composition ratios of the respective materials, are desired to have a relationship that $0.3<y<x<0.7$, $0.4<z<0.9$, $0.3<s<0.7$, and $0\leq t<0.3$ so that the degree of the superlattice mismatching is so large and the Al composition (x) of the n type $Al_xIn_{1-x}As$ lower carrier supplying layer 73a is higher than the Al composition (y) of the n type $Al_yIn_{1-y}As$ upper carrier supplying layer 73b (x>y). In the third and fourth embodiments, x=0.6, y=0.48, z=0.7, s=0.48, t=0.2 in view of the transistor characteristics.

A description is given of a method of fabricating a field effect transistor in accordance with the third and fourth embodiments.

In the method of fabricating the field effect transistor in accordance with the third and fourth embodiments, initially, an undoped $Al_xIn_{1-x}As$ buffer layer 72, an n type $Al_xIn_{1-x}As$ lower carrier supplying layer 73a, an undoped $Al_xIn_{1-x}As$ lower spacer layer 74a, an undoped $In_zGa_{1-z}As$ channel layer 105, an undoped $Al_yIn_{1-y}As$ upper spacer layer 74b, an n type $Al_yIn_{1-y}As$ upper carrier supplying layer 73b, an undoped $(Al_{1-s}Ga_s)_tIn_{1-t}As$ (0<s<1, 0≦t<1) Schottky junction forming layer 76, an n type $In_{0.53}Ga_{0.47}As$ lower contact layer 77, an n type $In_{0.48}Ga_{0.52}P$ etch stopping layer 78, an $n^+$ $In_{0.53}Ga_{0.47}As$ upper contact layer 79 are successively laminated on a semi-insulating InP substrate 70. After the lamination of the above layers, in the third embodiment, a source electrode and a drain electrode are formed, and then first and second recesses are produced, whereby a field effect transistor with a two-stage recessed structure is completed in the same fabrication process as that of the second embodiment shown in FIGS. 6(a) to 6(c). In the fourth embodiment, after the lamination of the respective layers, the first and second recesses are formed, and a buried gate is produced, followed by production of the source and drain electrodes. Thus, a field effect transistor having a buried gate electrode is completed in the same fabrication process as that of the first embodiment shown in FIG. 2. In the process step after lamination of the respective layers, the third and fourth embodiments use an etchant different from those used in the first and second embodiments in etching the $n^+$ type $In_{0.53}Ga_{0.47}As$ upper contact layer 79 until the etching front reaches the n type $In_{0.48}Ga_{0.52}P$ etch stopping layer 78 and in etching the n type $In_{0.53}Ga_{0.47}As$ lower contact layer 77 until the etching front reaches the undoped $(Al_{1-s}Ga_s)_tIn_{1-t}As$ (0<s<1, 0≦t<1) Schottky junction forming layer 76. However, in the same fabrication processes as in the first and second embodiments, a field effect transistor can be fabricated which has the buried gate (the fourth embodiment) and the two-stage recessed structure (the third embodiment), respectively.

As described above, in the third and fourth embodiments, the Al composition x of the n type $Al_xIn_{1-x}As$ lower carrier supplying layer 73b is higher than the Al composition y of the n type $Al_yIn_{1-y}As$ upper carrier supplying layer 73b, and therefore the electron affinity of the lower carrier supplying layer is smaller than the electron affinity of the upper carrier supplying layer. As a result, a field effect transistor where a lower heterojunction barrier height is higher than an upper heterojunction barrier height is produced, resulting in a field effect transistor having improved distortion characteristics.

In the third embodiment, the field effect transistor has a two-stage recessed structure, and therefore a high breakdown voltage can be obtained without degrading the performance of the field effect transistor. In the fourth embodiment, the field effect transistor has a buried gate structure, and therefore elements with stable surface levels can be fabricated. Moreover, in the first to fourth embodiments, the shapes of the recesses, the shape of the gate electrode, and the electrode materials are not specifically limited, and a recess of arbitrary shape, a gate electrode of arbitrary shape, and an arbitrary electrode material or the like may be used.

Embodiment 5

FIGS. 9(a) is a cross-sectional view schematically illustrating a structure of a field effect transistor in accordance with a fifth embodiment. In the figure, reference numeral 100 designates a semi-insulating GaAs substrate, numeral 101 designates an undoped $Al_{0.2}Ga_{0.8}As$/undoped GaAs superlattice buffer layer disposed on the semi-insulating GaAs substrate 100 and having a layer thickness of 8000 Å, numeral 102 designates an undoped $Al_{0.2}Ga_{0.8}As$ buffer layer disposed on the superlattice buffer layer 101 and having a layer thickness of 2000 Å, numeral 103a designates an n type $Al_{0.2}Ga_{0.8}As$ lower carrier supplying layer disposed on the buffer layer 102 and having a layer thickness of 50 Å, and comprising Si, Se, or the like as an impurity at an impurity concentration of $3\times10^{18}$ cm$^{-3}$, numeral 104a designates an undoped $Al_{0.2}Ga_{0.8}As$ lower spacer layer disposed on the lower carrier supplying layer 103a and having a layer thickness of 30 Å, numeral 205 designates an undoped $In_zGa_{1-z}As$ graded channel layer disposed on the lower spacer layer 104a and having a layer thickness of 200 Å, numeral 104b designates an undoped $Al_yGa_{1-y}As$ upper spacer layer disposed on the channel layer 205 and having a layer thickness of 30 Å, numeral 103b designates an n type $Al_yGa_{1-y}As$ upper carrier supplying layer disposed on the upper spacer layer 104b and having a layer thickness of 100 Å, and comprising Si, Se, or the like as an impurity at an impurity concentration of $3\times10^{18}$ cm$^{-3}$, numeral 106 designates an undoped $Al_{0.2}Ga_{0.8}As$ Schottky junction forming layer disposed on the upper carrier layer 103b and having a layer thickness of 200 Å, numeral 107 designates an n type GaAs lower contact layer disposed on the Schottky junction forming layer 106 and having a layer thickness of 1000 Å, and comprising Si, Se, or the like as an impurity at an impurity concentration of $5\times10^{16}$ cm$^{-3}$, numeral 108 designates an n type $Al_{0.2}Ga_{0.8}As$ etch stopping layer disposed on the lower contact layer 107 and having a layer thickness of 10 Å, numeral 109 designates an $n^+$ type GaAs contact layer disposed on the etch stopping layer 108 and having a layer thickness of 2000 Å, and comprising Si, Se, or the like as an impurity at an impurity concentration of $2\times10^{18}$ cm$^{-3}$, numeral 110 designates a source electrode, numeral 111 designates a drain electrode, numeral 112 designates a gate electrode. In the figure, the same reference numerals shown in FIG. 10 designate the same or corresponding parts.

In the field effect transistor according to the fifth embodiment, the In composition z of the graded channel 205 gradually changes as $z_1 \to z_2$ ($0<z_2<z_1<1$) from the lower edge to the upper edge of the channel layer. The values of $z_1$ and $z_2$ are desired to have a relationship of $0<z_2<z_1<0.25$ so that the degree of the lattice mismatching does not become so large. In the fifth embodiment, $z_1=0.2$, $z_2=0.1$ in view of the transistor characteristics.

A description is given of a method of fabricating a field effect transistor according to the fifth embodiment.

Figure 9:
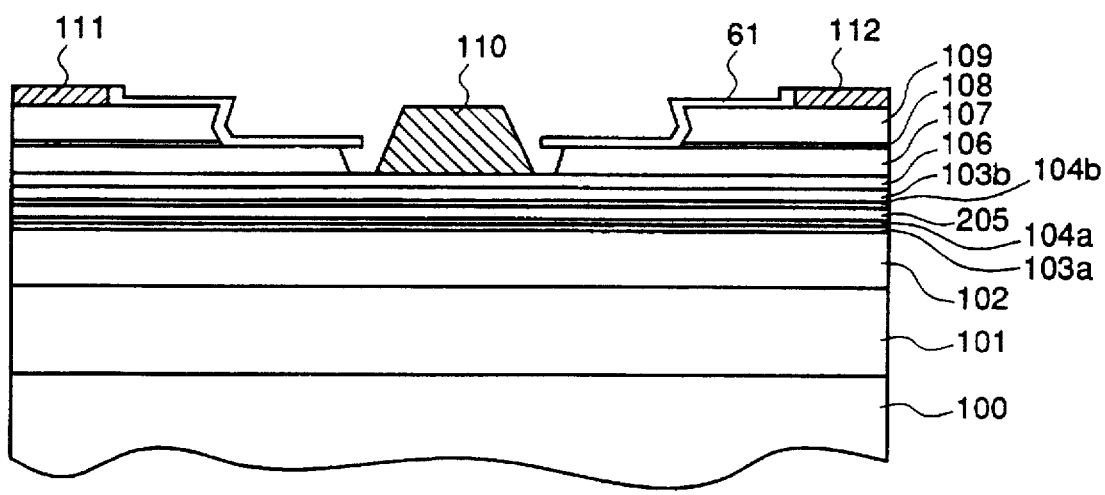
FIG. 9(a) is a cross-sectional view schematically illustrating a field effect transistor of the fifth embodiment.
FIG. 9(b) is an expanded view of a graded channel layer and its vicinity in accordance with a sixth embodiment of the present invention.
Figure 9:
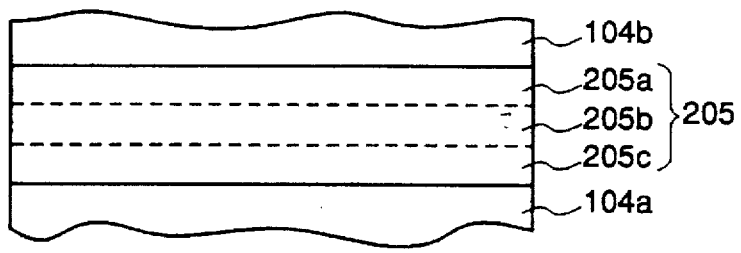

In the method of fabricating the field effect transistor of the fifth embodiment shown in FIG. 9, a superlattice buffer layer 101, an undoped $Al_{0.2}Ga_{0.8}As$ buffer layer 102, an n type $Al_{0.2}Ga_{0.8}As$ lower carrier supplying layer 103a, an undoped $Al_{0.2}Ga_{0.8}As$ lower spacer layer 104a, an undoped $In_zGa_{1-z}As$ graded channel layer 205, an undoped $Al_yGa_{1-y}As$ upper spacer layer 104b, an n type $Al_yGa_{1-y}As$ upper carrier supplying layer 103b, an undoped $Al_{0.2}Ga_{0.8}As$ Schottky junction forming layer 106, an n type GaAs lower contact layer 107, an n type $Al_{0.2}Ga_{0.8}As$ etch stopping layer 108, an $n^+$ type GaAs contact layer 109 are successively laminated on a semi-insulating GaAs substrate 100. The respective layers except the graded channel layer 205 are the same as those of the prior art transistor shown in FIG. 10, and therefore the description on the layers is omitted.

In the process step of forming the graded channel layer 205 in accordance with the fifth embodiment, the graded channel layer is grown so that the In composition z of that layer gradually decreases from 0.2 to 0.1 from the lower carrier supplying layer 103b to the upper carrier supplying layer 103a. The adjustment of the composition ratios during the growth of this layer is carried out by adjusting the temperatures of the cells that are the sources of the grown materials in the case of MBE while the adjustment is carried out by adjusting the rate of flow of the material source gases in the case of MOCVD. Thus, after lamination of the respective layers, the electrodes and the recesses are formed as already described way, whereby the field effect transistor is completed.

A description is given of the operation and the effects of the field effect transistor according to the fifth embodiment.

Figure 8:
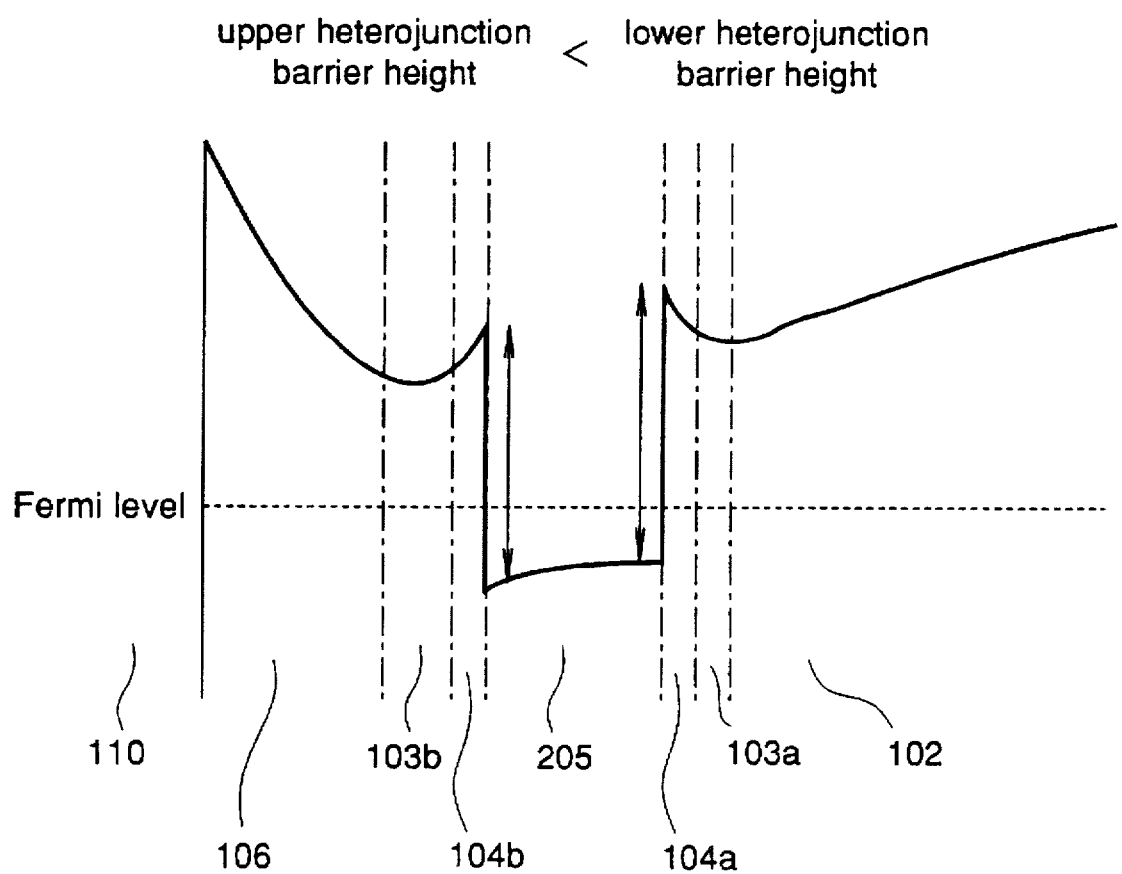
FIG. 8 is an energy band diagram at a lower edge of a conduction band in a field effect transistor in accordance with a fifth embodiment of the present invention.

FIG. 8 is an energy band diagram at the lower edge of the conduction band of the field effect transistor in accordance with the fifth embodiment. In the fifth embodiment, an InGaAs graded channel layer is formed so that the electron affinity of the graded channel 205 gradually decreases from the bottom to the top of the channel layer, that is, the In composition of the InGaAs graded channel layer 205 is gradually decreases from the bottom to the top of the channel layer 205. Therefore, the lower heterojunction barrier height becomes higher than the upper heterojunction barrier height as shown in FIG. 4, thereby producing a field effect transistor having an improved distortion characteristic and smaller leakage to adjacent lines in frequency multiplexed communication.

Embodiment 6

In a field effect transistor of the sixth embodiment, the graded channel layer 205 of the fifth embodiment has a step-graded structure where the In composition z has stepwise changes. FIG. 9(b) is an expanded sectional view schematically illustrating the graded channel layer 205 and its vicinity.

In the sixth embodiment, the graded channel layer 205 of the fifth embodiment has a step-graded channel structure comprising three layers of different In compositions (205a, 205b, 205c). The graded channel layer 205 of the sixth embodiment comprises a channel layer 205c with an In composition $z_1$, a channel layer 205b with an In composition $z_2$, and a channel layer 205a with an In composition $z_3$, and the In composition z has stepwise changes as $z_1 \to z_2 \to z_3$ ($0 < z_3 < z_2 < z_1 < 1$) from the bottom to the top of the graded channel layer. The values of $z_1$, $z_2$, $z_3$ are desired to have a relationship of $0 < z_3 < z_2 < z_1 < 0.25$ so that the degree of the lattice mismatching is not so large. In the sixth embodiment, $z_1 = 0.2$, $z_2 = 0.15$, and $z_3 = 0.1$ in view of the transistor characteristics. The respective layers other than the graded channel layer 205 are the same as those of the fourth embodiment.

In a method of fabricating the field effect transistor of the sixth embodiment, after lamination of the respective layers including an undoped $Al_{0.2}Ga_{0.8}As$ lower spacer 104a as the uppermost layer disposed on a semi-insulating GaAs substrate, an undoped $In_zGa_{1-z}As$ layer 205c having an In composition of 0.2 ($z_1$), an undoped $In_zGa_{1-z}As$ layer 205b having an In composition of 0.15 ($z_2$), an undoped $In_zGa_{1-z}As$ layer 205a having an In composition of 0.1 ($z_3$) are successively grown, and then the rest of the layers from an undoped $Al_yGa_{1-y}As$ upper spacer layer 104b to an $n^+$ type GaAs contact layer 109 are successively laminated as in the case of the prior art device. Afterward, production of electrodes and formation of recesses are carried out in the same way as the prior art method, whereby a field effect transistor is completed.

Thus, in the sixth embodiment, the graded channel layer 205 has a step-graded channel structure which comprises plural layers of different In compositions. Therefore, a field effect transistor can be obtained having improved distortion characteristics and reduced leakage to adjacent lines in frequency multiplexed communication. Moreover, since the sixth embodiment has a step-graded structure where the In composition ratio has stepwise changes, the graded channel layers can be stably fabricated.

Embodiments 7 and 8

Figure 13:
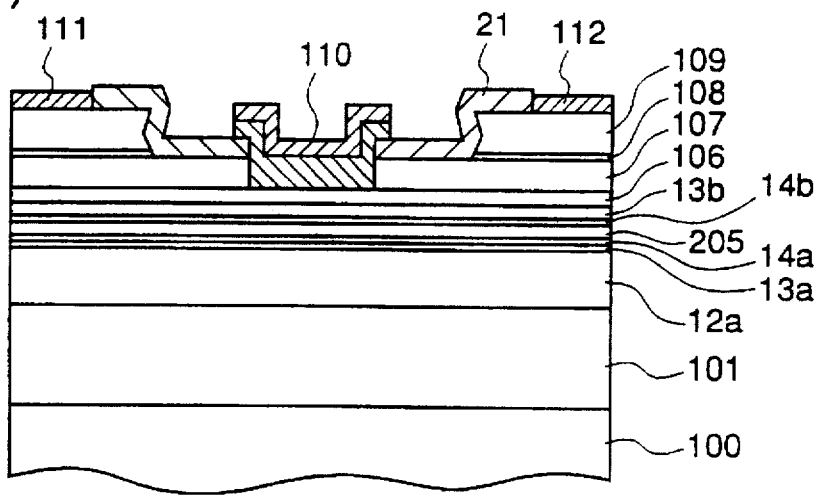
FIG. 13(a) is a cross-sectional view schematically illustrating a field effect transistor in accordance with a seventh embodiment of the present invention.
FIG. 13(b) is a cross-sectional view schematically illustrating a field effect transistor of a ninth embodiment of the present invention.
FIG. 13(c) is a cross-sectional view schematically illustrating a field effect transistor in accordance with an eleventh embodiment of the present invention.
Figure 13:
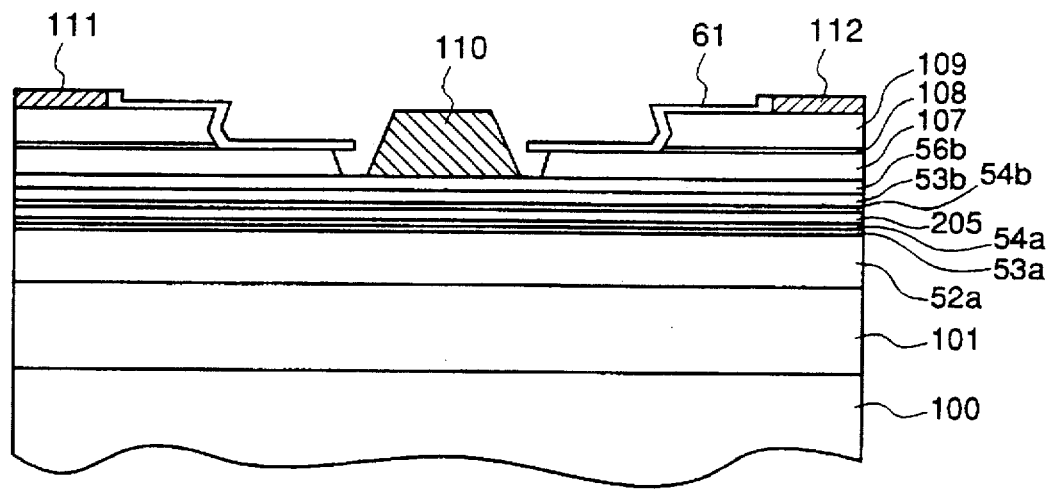
Figure 13:
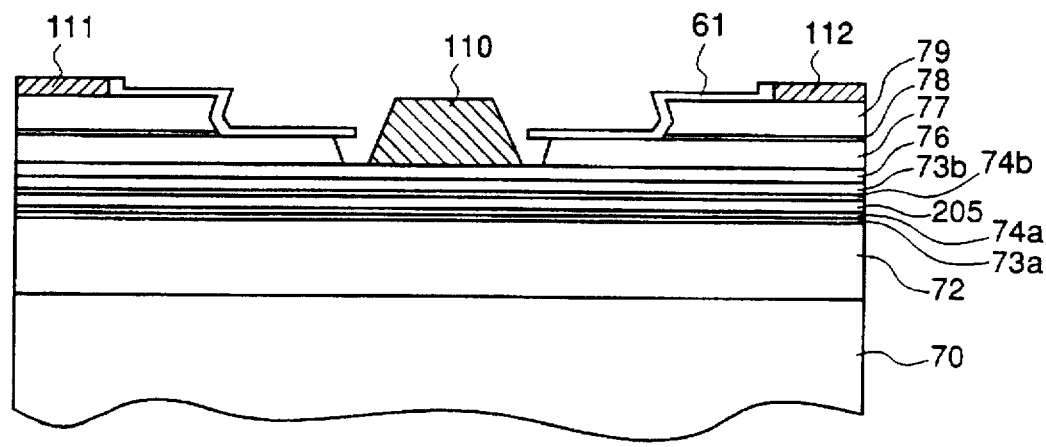

FIG. 13(a) is a cross-sectional view schematically illustrating a field effect transistor in accordance with seventh and eighth embodiments. The respective layers of the seventh embodiment are the same as those of the first embodiment shown in FIG. 1 except that the channel layer 105 is replaced with the graded channel layer 205 of the fifth embodiment shown in FIG. 9(a), and the respective layers of the eighth embodiment are the same as those of the first embodiment shown in FIG. 1 except that the channel layer 105 is replaced with the graded channel layer 205 of the sixth embodiment having the step-graded structure shown in FIG. 9(b).

In the figure, reference numeral 100 designates a semi-insulating GaAs substrate, numeral 101 designates an undoped $Al_{0.2}Ga_{0.8}As$/undoped GaAs superlattice buffer layer disposed on the semi-insulating GaAs substrate 100 and having a layer thickness of 8000 Å, numeral 12a designates an undoped $Al_xGa_{1-x}As$ buffer layer disposed on the superlattice buffer layer 101 and having a layer thickness of 2000 Å, numeral 13a designates an n type $Al_xGa_{1-x}As$ lower carrier supplying layer disposed on the buffer layer 12a and having a layer thickness of 50 Å, and comprising Si, Se, or the like as an impurity at an impurity concentration of $3 \times 10^{18}$ cm$^{-3}$, numeral 14a designates an undoped $Al_xGa_{1-x}As$ lower spacer layer disposed on the lower carrier supplying layer 13a and having a layer thickness of 30 Å, numeral 205 designates an undoped $In_zGa_{1-z}As$ graded channel layer disposed on the lower spacer layer 14a and having a layer thickness of 200 Å, numeral 14b designates an undoped $Al_yGa_{1-y}As$ upper spacer layer disposed on the graded channel layer 205 and having a layer thickness of 30 Å, numeral 13b designates an n type $Al_yGa_{1-y}As$ upper carrier supplying layer disposed on the upper spacer layer 14b and having a layer thickness of 100 Å, and comprising Si, Se, or the like as an impurity at an impurity concentration of $3 \times 10^{18}$ cm$^{-3}$, numeral 106 designates an undoped $Al_yGa_{1-y}As$ Schottky junction forming layer disposed on the upper carrier layer 13b and having a layer thickness of 200 Å, numeral 107 designates an n type GaAs lower contact layer disposed on the Schottky junction forming layer 106 and having a layer thickness of 1000 Å, and comprising Si, Se, or the like as an impurity at an impurity concentration of $5 \times 10^{16}$ cm$^{-3}$, numeral 108 designates an n type $Al_{0.2}Ga_{0.8}As$ etch stopping layer disposed on the lower contact layer 107 and having a layer thickness of 10 Å, numeral 109 designates an $n^+$ type GaAs contact layer disposed on the etch stopping layer 108 and having a layer thickness of 2000 Å, and comprising Si, Se, or the like as an impurity at an impurity concentration of $2 \times 10^{18}$ cm$^{-3}$, numeral 110 designates a source electrode, numeral 111 designates a drain electrode, and numeral 112 designates a gate electrode, respectively. In the figure, the same reference numerals shown in FIGS. 1 to 9 designate the same or corresponding parts.

The values of x, y, z ($0<x$, y, $z<1$), which indicate the composition ratios of the respective materials in the seventh embodiment, are desired to have a relationship that $0.1<y<x<0.4$, $0<z<0.25$ so that the degree of the lattice mismatching is not so large, and the Al composition (x) of the n type $Al_xGa_{1-x}As$ lower carrier supplying layer 13a is larger than the Al composition (y) of the n type $Al_yGa_{1-y}As$ upper carrier supplying layer (x>y), and the In composition z of the graded channel layer 205 gradually changes as $z_1 \rightarrow z_2$ ($0<z_2<z_1<1$) from the bottom to the top of the channel layer. In the seventh embodiment, x=0.3, y=0.2, $z_1$=0.2, $z_2$=0.1 in view of the transistor characteristics.

In the eighth embodiment, the values of $z_1$, $z_2$, $z_3$, which indicate the In compositions of the stepwise graded channel layer 205, are desired to have a relationship of $0<z_3<z_2<z_1<0.25$ so that the graded channel layer 205 has a step-graded structure where the In composition z has stepwise changes as $z_1 \rightarrow z_2 \rightarrow z_3$ ($0<z_3<z_2<z_1<1$) from the bottom to the top of the channel layer. In the eighth embodiment, x=0.3, y=0.2, $z_1$=0.2, $z_2$=0.15, $z_3$=0.1 in view of the transistor characteristics.

In the seventh and eighth embodiments, the lamination of the respective layers from the semi-insulating GaAs substrate 100 to the undoped $Al_xGa_{1-x}As$ lower spacer layer 14a, the lamination of the other respective layers from the undoped $Al_yGa_{1-y}As$ upper spacer layer 14b to the $n^+$ type GaAs contact layer 109, the production of the electrodes and the formation of the recesses are carried out in the same steps as those used in the first embodiment. As for the undoped $In_zGa_{1-z}As$ graded channel layer 205, the method of growing the graded channel layer 205 in the seventh embodiment is the same as the method used in the fifth embodiment, and the method of growing the layer 205 in the eighth embodiment is the same as that in the sixth embodiment.

Embodiments 9 and 10

FIG. 13(b) is a cross-sectional view schematically showing a field effect transistor according to ninth and tenth embodiments of the present invention. In the ninth embodiment, the respective layers are identical to the respective layers of the second embodiment shown in FIG. 5 except that the channel layer 105 of the second embodiment shown in FIG. 5 is replaced with the graded channel layer 205 of the fifth embodiment shown in FIG. 9 and, in the tenth embodiment, the respective layers are identical to the respective layers of the second embodiment shown in FIG. 5 except that the channel layer 105 shown in FIG. 5 is replaced with the graded channel layer 205 having the step-graded structure of the sixth embodiment shown in FIG. 9(b).

In the figure, reference numeral 100 designates a semi-insulating GaAs substrate, numeral 101 designates an undoped $Al_{0.2}Ga_{0.8}As$/undoped GaAs superlattice buffer layer disposed on the semi-insulating GaAs substrate 100 and having a layer thickness of 8000 Å, numeral 52a designates an undoped $In_{1-x}Ga_xP$ buffer layer disposed on the superlattice buffer layer 52a and having a layer thickness of 2000 Å, numeral 53a designates an n type $In_{1-x}Ga_xP$ lower carrier supplying layer disposed on the buffer layer 52a and having a layer thickness of 50 Å, and comprising Si, Se, or the like as an impurity at an impurity concentration of $3 \times 10^{18}$ cm$^{-3}$, numeral 54a designates an undoped $In_{1-x}Ga_xP$ lower spacer layer disposed on the lower carrier supplying layer 53a and having a layer thickness of 30 Å, numeral 205 designates an undoped $In_zGa_{1-z}As$ graded channel layer disposed on the lower spacer layer 54a and having a layer thickness of 200 Å, numeral 54b designates an undoped $In_{1-y}Ga_yP$ upper spacer layer disposed on the graded channel 205 and having a layer thickness of 30 Å, numeral 53b designates an n type $In_{1-y}Ga_yP$ upper carrier supplying layer disposed on the upper spacer layer 54b and having a layer thickness of 100 Å, and comprising Si, Se, or the like as an impurity at an impurity concentration of $3 \times 10^{18}$ cm$^{-3}$, numeral 56b designates an undoped $In_{1-y}Ga_yP$ Schottky junction forming layer disposed on the upper carrier supplying layer 53b and having a layer thickness of 200 Å, numeral 107 designates an n type GaAs lower contact layer disposed on the Schottky junction forming layer 56b and having a layer thickness of 1000 Å, and comprising Si, Se, or the like as an impurity at an impurity concentration of $5 \times 10^{16}$ cm$^{-3}$, numeral 108 designates an n type $Al_{0.2}Ga_{0.8}As$ etch stopping layer disposed on the lower contact layer 107 and having a layer thickness of 10 Å, numeral 109 designates an $n^+$ type GaAs contact layer disposed on the etch stopping layer 108 and having a layer thickness of 2000 Å, and comprising Si, Se, or the like as an impurity at an impurity concentration of $2 \times 10^{18}$ cm$^{-3}$, numeral 110 designates a gate electrode, numeral 111 designates a source electrode, and numeral 112 designates a drain electrode. In the figure, the same numeral references shown in FIGS. 5 and 9 designate the same or corresponding parts.

In the ninth embodiment, the values of x, y, z, ($0<x$, y, $z,<1$), which indicate the composition ratios of the respective materials, are desired to have a relationship that $0.1<y<x<0.4$, $0<z<0.25$ so that the degree of the lattice mismatching does not become so large, and the Ga composition (x) of the n type $In_{1-x}Ga_xP$ lower carrier supplying layer 53a is larger than the Ga composition (y) of the n type $In_{1-y}Ga_yP$ upper carrier supplying layer 53b (x>y), and the In composition z of the graded channel layer 205 gradually changes as $z_1 \rightarrow z_2$ ($0<z_2<z_1<1$) from the bottom to the top of the channel layer. In the ninth embodiment, x=0.6, y=0.5, $z_1$=0.2, $z_2$=0.1 in view of the transistor characteristics.

In the tenth embodiment, as explained for the sixth embodiment, the values of $z_1$, $z_2$, $z_3$, which indicate the In compositions of the respective layers included in the graded channel layer 205, are desired to have a relationship of $0<z_3<z_2<z_1<0.25$ so that the graded channel layer 205 has a step-graded structure where the In composition z has stepwise changes as $z_1 \rightarrow z_2 \rightarrow z_3$ ($0<z_3<z_2<z_1<1$) from the bottom to the top of the channel layer. In the tenth embodiment, x=0.6, y=0.5, $z_1$=0.2, $z_2$=0.15, $z_3$=0.1 in view of the transistor characteristics.

In the ninth and tenth embodiments, the lamination of the respective layers from the semi-insulating GaAs substrate 100 to the undoped $In_{1-x}Ga_xP$ lower spacer layer 54a, the lamination of the other respective layers from the undoped $In_{1-y}Ga_yP$ upper spacer layer 54b to the $n^+$ type GaAs contact layer 109, the production of the electrodes and the formation of the recesses are carried out in the same steps as in the second embodiment. As for the undoped $In_zGa_{1-z}As$ graded channel layer 205, the method of growing the graded channel layer 205 in the ninth embodiment is the same as that in the fifth embodiment, and the method of growing the graded channel layer 205 in the tenth embodiment is the same as that in the sixth embodiment.

Embodiments 11 and 12

FIG. 13(c) is a cross-sectional view schematically showing a field effect transistor according to eleventh and twelfth embodiments. In the eleventh embodiment, the respective layers are identical to the respective layers of the third embodiment shown in FIG. 7 except that the channel layer 105 of the third embodiment shown in FIG. 7 is replaced with the graded channel layer 205 of the fifth embodiment shown in FIG. 9. In the twelfth embodiment, the respective layers are identical to the respective layers of the third embodiment shown in FIG. 7 except that the channel layer 105 of the third embodiment shown in FIG. 7 is replaced with the graded channel layer 205 having the step-graded structure of the sixth embodiment shown in FIG. 9(b).

In the figure, reference numeral 70 designates a semi-insulating InP substrate, numeral 72 designates an undoped $Al_xIn_{1-x}As$ buffer layer disposed on the semi-insulating GaAs substrate 70 and having a layer thickness of 2500 Å, numeral 73a designates an n type $Al_xIn_{1-x}As$ lower carrier supplying layer disposed on the buffer layer 72 and having a layer thickness of 50 Å, and comprising Si, Se, or the like as an impurity at an impurity concentration of $3 \times 10^{18}$ cm$^{-3}$, numeral 74a designates an undoped $Al_xIn_{1-x}As$ lower spacer layer disposed on the lower carrier supplying layer 73a and having a layer thickness of 30 Å, numeral 205 designates an undoped $In_zGa_{1-z}As$ graded channel layer disposed on the lower spacer layer 74a and having a layer thickness of 200 Å, numeral 74b designates an undoped $Al_yIn_{1-y}As$ upper spacer layer disposed on the graded channel 205 and having a layer thickness of 30 Å, numeral 73b designates an n type $Al_yIn_{1-y}As$ upper carrier supplying layer disposed on the upper spacer layer 74b and having a layer thickness of 100 Å, and comprising Si, Se, or the like as an impurity at an impurity concentration of $3 \times 10^{18}$ cm$^{-3}$, numeral 76 designates an undoped $(Al_{1-s}Ga_s)_tIn_{1-t}As$ ($0<s<1$, $0 \leq t<1$) Schottky junction forming layer disposed on the upper carrier supplying layer 73b and having a layer thickness of 200 Å, numeral 77 designates an n type $In_{0.53}Ga_{0.47}As$ lower contact layer disposed on the Schottky junction forming layer 76 and having a layer thickness of 1000 Å, and comprising Si, Se, or the like as an impurity at an impurity concentration of $5 \times 10^{16}$ cm$^{-3}$, numeral 78 designates an n type $In_{0.48}Ga_{0.52}P$ etch stopping layer disposed on the lower contact layer 77 and having a layer thickness of 10 Å, numeral 79 designates an n$^+$ type $In_{0.53}Ga_{0.47}As$ upper contact layer disposed on the etch stopping layer 78 and having a layer thickness of 2000 Å, and comprising Si, Se, or the like as an impurity at an impurity concentration of $2 \times 10^{18}$ cm$^{-3}$, numeral 110 designates a source electrode, numeral 111 designates a drain electrode, and numeral 112 designates a gate electrode. In the figure, the same reference numerals shown in FIGS. 7 and 9 designate the same or corresponding parts.

In the eleventh embodiment, the values of x, y, z, s, t ($0<x$, y, z, s, t$<1$), which indicate the composition ratios of the respective materials, are desired to have a relationship that $0.3<y<x<0.7$, $0.4<z<0.9$, $0.3<s$ $0.7$, and $0 \leq t<0.3$ so that the degree of the lattice mismatching is not so large, and the Al composition (x) of the n type $Al_xIn_{1-x}As$ lower carrier supplying layer 73a is larger than the Al composition (y) of the n type $Al_yIn_{1-y}As$ upper carrier supplying layer 73b (x>y), and the In composition z of the graded channel layer 205 gradually changes as $z_1 \rightarrow z_2$ ($0<z_2<z_1<1$) from the bottom to the top of the channel layer. In the eleventh embodiment, x=0.6, y=0.48, s=0.48, t=0.2, $z_1$=0.7, $z_2$=0.53 in view of the transistor characteristics.

In the twelfth embodiment, as explained for the sixth embodiment, the graded channel layer 205 is desired to have a relationship that $0.3<y<x<0.7$, $0.4<z<0.9$, $0.3<s<0.7$, $0 \leq t<0.3$ so that the graded channel layer 205 has a step-graded structure where the In composition z has stepwise changes as $z_1 \rightarrow z_2 \rightarrow z_3$ ($0<z_3<z_2<z_1<1$) from the bottom to the top of the channel layer. In the twelfth embodiment, x=0.6, y=0.48, t=0.2, $z_1$=0.7, $z_2$=0.6, $z_3$=0.53.

In the eleventh and twelfth embodiments, the lamination of the respective layers from the semi-insulating InP substrate 70 to the undoped $Al_xIn_{1-x}As$ lower spacer layer 74a, the lamination of the other respective layers from the undoped $Al_yIn_{1-y}As$ upper spacer layer 74b to the n$^+$ type GaAs contact layer 79, and the production of the electrodes and the formation of the recesses are carried out in steps identical to the methods of the third embodiment. As for the undoped $In_zGa_{1-z}As$ graded channel layer 205, the method of growing the graded channel layer 205 in the eleventh embodiment is the same as that in the fifth embodiment, and the method of growing the graded channel layer 205 in the twelfth embodiment is the same as that in the sixth embodiment.

What is claimed is:

1. A field effect transistor comprising:
  a semi-insulating semiconductor substrate having a surface;
  a buffer layer disposed on the surface of the substrate and having a high resistance;
  a laminated semiconductor layer structure disposed on the buffer layer and including, serially arranged:
    a first semiconductor layer having a first, relatively high concentration of a dopant impurity,
    a second semiconductor layer having a second, relatively low concentration of a dopant impurity, lower than the first concentration, and
    a third semiconductor layer having a third, relatively high concentration of a dopant impurity;
  a fourth semiconductor layer disposed on the laminated semiconductor layer structure; and
  a gate electrode disposed on the fourth semiconductor layer wherein the first and third semiconductor layers are ternary semiconductor materials comprising the same three elements, the second semiconductor layer has an electron affinity larger than electron affinities of the first and third semiconductor layers, and the difference between the electron affinities of the first and second semiconductor layers is larger than the difference between the electron affinities of the second and third semiconductor layers.

2. The field effect transistor of claim 1 wherein the electron affinity of the first semiconductor layer is smaller than the electron affinity of the third semiconductor.

3. The field effect transistor of claim 1 wherein the electron affinity of the second semiconductor layer gradually decreases in a direction from the first semiconductor layer to the third semiconductor layer.

4. The field effect transistor of claim 2 wherein the first and third semiconductor layers comprise AlGaAs and the third semiconductor layer has a higher Al composition than the first semiconductor layer.

5. The field effect transistor of claim 2 wherein the first and third semiconductor layers comprise InGaP and the first semiconductor layer has a larger Ga composition than the third semiconductor layer.

6. The field effect transistor of claim 2 wherein the first and third semiconductor layers comprise AlInAs and the first semiconductor layer has a higher Al composition than the third semiconductor layer.

7. (Amended) The field effect transistor of claim 3 wherein the second semiconductor layer comprises InGaAs having an In composition that decreases along a direction from the first semiconductor layer to the third semiconductor layer.

8. The field effect transistor of claim 1 wherein the ternary semiconductor material of the first and third semiconductor layers comprises two elements chosen from the group consisting of Al, Ga, and In and one element chosen from the group consisting of As and P.

9. The field effect transistor of claim 1 including a contact layer disposed on the fourth semiconductor layer on opposite sides of the gate electrode, and source and drain electrodes in electrical contact with the contact layer at opposite sides of the gate electrode.

* * * * *